US012712418B2

(12) United States Patent
Pump

(10) Patent No.: US 12,712,418 B2
(45) Date of Patent: Aug. 18, 2026

(54) INVERTER HAVING SEAL MEMBER BETWEEN POWER SEMI-CONDUCTOR AND INVERTER MOUNT

(71) Applicant: AMERICAN AXLE & MANUFACTURING, INC., Detroit, MI (US)

(72) Inventor: Christopher D. Pump, Macomb, MI (US)

(73) Assignee: AMERICAN AXLE & MANUFACTURING, INC., Detroit, MI (US)

( * ) Notice: Subject to any disclaimer, the term of this patent is extended or adjusted under 35 U.S.C. 154(b) by 199 days.

(21) Appl. No.: 18/710,543

(22) PCT Filed: Nov. 9, 2022

(86) PCT No.: PCT/US2022/049362
§ 371 (c)(1),
(2) Date: May 15, 2024

(87) PCT Pub. No.: WO2023/091338
PCT Pub. Date: May 25, 2023

(65) Prior Publication Data

US 2025/0007363 A1 Jan. 2, 2025

Related U.S. Application Data

(60) Provisional application No. 63/264,201, filed on Nov. 17, 2021.

(51) Int. Cl.
*H02K 11/33* (2016.01)
*H10W 40/22* (2026.01)

(52) U.S. Cl.
CPC ............ *H02K 11/33* (2016.01); *H10W 40/22* (2026.01)

(58) Field of Classification Search
CPC ............................... H02K 11/33; H10W 40/22
(Continued)

(56) References Cited

U.S. PATENT DOCUMENTS 5,313,098 A * 5/1994 Tumpey ................ H10W 40/47 257/E23.098
10,170,957 B2 1/2019 Ishizaki
(Continued)

FOREIGN PATENT DOCUMENTS

JP 2004214430 A 7/2004
JP 2014013878 A 1/2014
(Continued)

OTHER PUBLICATIONS

International Search Report and Written Opinion issued for PCT/US2022/049362 mailed on Mar. 24, 2023.

*Primary Examiner* — Rashad H Johnson
(74) *Attorney, Agent, or Firm* — DICKINSON WRIGHT PLLC

(57) ABSTRACT

An electric drive unit having a motor assembly with a stator, a rotor, which is rotatably received in the stator, and an inverter that includes an inverter mount, a plurality of heat-sinked power semiconductors, and a plurality of seal members. The inverter mount has a base that defines a plurality of terminal apertures. Each heat-sinked power semiconductor includes a power semiconductor, which has a body and a plurality of terminals that extend from the body, and a heat sink that is fixedly and thermally coupled to the body of the power semiconductor. The terminals of each of the power semiconductors are received through a corresponding one of the seal members and through a set of the terminal apertures. Each seal member forms a seal between the power semiconductor and the inverter mount that inhibits fluid flow through the terminal apertures.

8 Claims, 7 Drawing Sheets

(58) Field of Classification Search
USPC ........................................................ 310/68 D
See application file for complete search history.

(56) References Cited

U.S. PATENT DOCUMENTS

| | | | | |
|---|---|---|---|---|
| 12,043,131 | B2 * | 7/2024 | Meier | B60L 53/302 |
| 12,471,259 | B2 * | 11/2025 | Fuechtner | H05K 7/20927 |
| 2010/0209266 | A1 * | 8/2010 | Ikeda | F04C 23/02 318/3 |
| 2010/0238629 | A1 * | 9/2010 | Shiba | H10W 40/47 361/699 |
| 2011/0256002 | A1 * | 10/2011 | Ikeda | F04C 23/008 417/410.1 |
| 2011/0268593 | A1 * | 11/2011 | Yamada | F04B 35/04 310/55 |
| 2012/0212907 | A1 * | 8/2012 | Dede | H05K 7/20927 361/689 |
| 2019/0069450 | A1 * | 2/2019 | Suzuki | B60L 53/302 |
| 2019/0111862 | A1 * | 4/2019 | Dede | H05K 7/20145 |
| 2021/0016625 | A1 * | 1/2021 | Lee | B60H 1/00278 |
| 2021/0094441 | A1 * | 4/2021 | Sampson | B60K 1/02 |
| 2021/0094443 | A1 * | 4/2021 | Aikawa | B60L 58/26 |
| 2022/0304184 | A1 * | 9/2022 | Rigbers | H05K 7/209 |
| 2023/0124909 | A1 * | 4/2023 | An | H05K 7/20936 257/675 |
| 2023/0141875 | A1 * | 5/2023 | Yoshimatsu | H10W 40/47 310/54 |

FOREIGN PATENT DOCUMENTS

| | | | |
|---|---|---|---|
| JP | 2016226096 | A | 12/2016 |
| JP | 2017093080 | A | 5/2017 |

* cited by examiner 20
16
10
14
12
20
506

12
40
100
44
46
48
52
516
518
92
600
506
94
96
500
42
508
526
90
610
50

506
94
502
522
508
520
520
92
522

500
516
506
508
514
512
510
514
502

92
520
522
526
526

520a
524
524
92
522
520

600
510
90
514
512
514
524
524

12
40
100
44
46
48
52
516
518
92
650
600'
506
94
96
500'
42
508
526
90'
610
50

INVERTER HAVING SEAL MEMBER BETWEEN POWER SEMI-CONDUCTOR AND INVERTER MOUNT

CROSS-REFERENCE TO RELATED APPLICATIONS

This application claims the benefit of U.S. Provisional Patent Application No. 63/264,201,588 filed Nov. 17, 2021, the disclosure of which is incorporated by reference as if fully set forth in detail herein.

FIELD

The present disclosure relates to an inverter having a seal member between a power semi-conductor and an inverter mount.

BACKGROUND

This section provides background information related to the present disclosure which is not necessarily prior art.

International Patent Application PCT/US2020/029925 entitled "Electric Drive Unit" discloses an electric drive unit with an inverter that is mounted to the stator of an electric motor. The inverter includes a plurality of power semiconductor devices, which are employed to switch power to various phases of the windings of the electric motor, a plurality of heat sinks that are each mounted to a corresponding one of the power semiconductor devices, and an inverter mount that is employed to position and retain the power semiconductor devices. A coolant fluid is circulated through the heat sinks and into the stator of the electric motor to cool the inverter and the electric motor.

While the above inverter configuration is suited for its intended purpose, it is nevertheless susceptible to improvement.

SUMMARY

This section provides a general summary of the disclosure, and is not a comprehensive disclosure of its full scope or all of its features.

In one form, the present disclosure provides an electric drive unit having a motor assembly with a stator, a rotor, which is rotatably received in the stator, and an inverter. The inverter includes an inverter mount, a plurality of heat-sinked power semiconductors, and a plurality of seal members. The inverter mount has a base that defines a plurality of semiconductor terminal apertures. Each heat-sinked power semiconductor includes a power semiconductor, which has a body and a plurality of terminals that extend from the body, and a heat sink that is fixedly and thermally coupled to the body of the power semiconductor. The terminals of each of the power semiconductors are received through a corresponding one of the seal members and through a corresponding set of the semiconductor terminal apertures. The seal members form seals between the power semiconductor and the inverter mount that inhibit fluid flow through the semiconductor terminal apertures.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
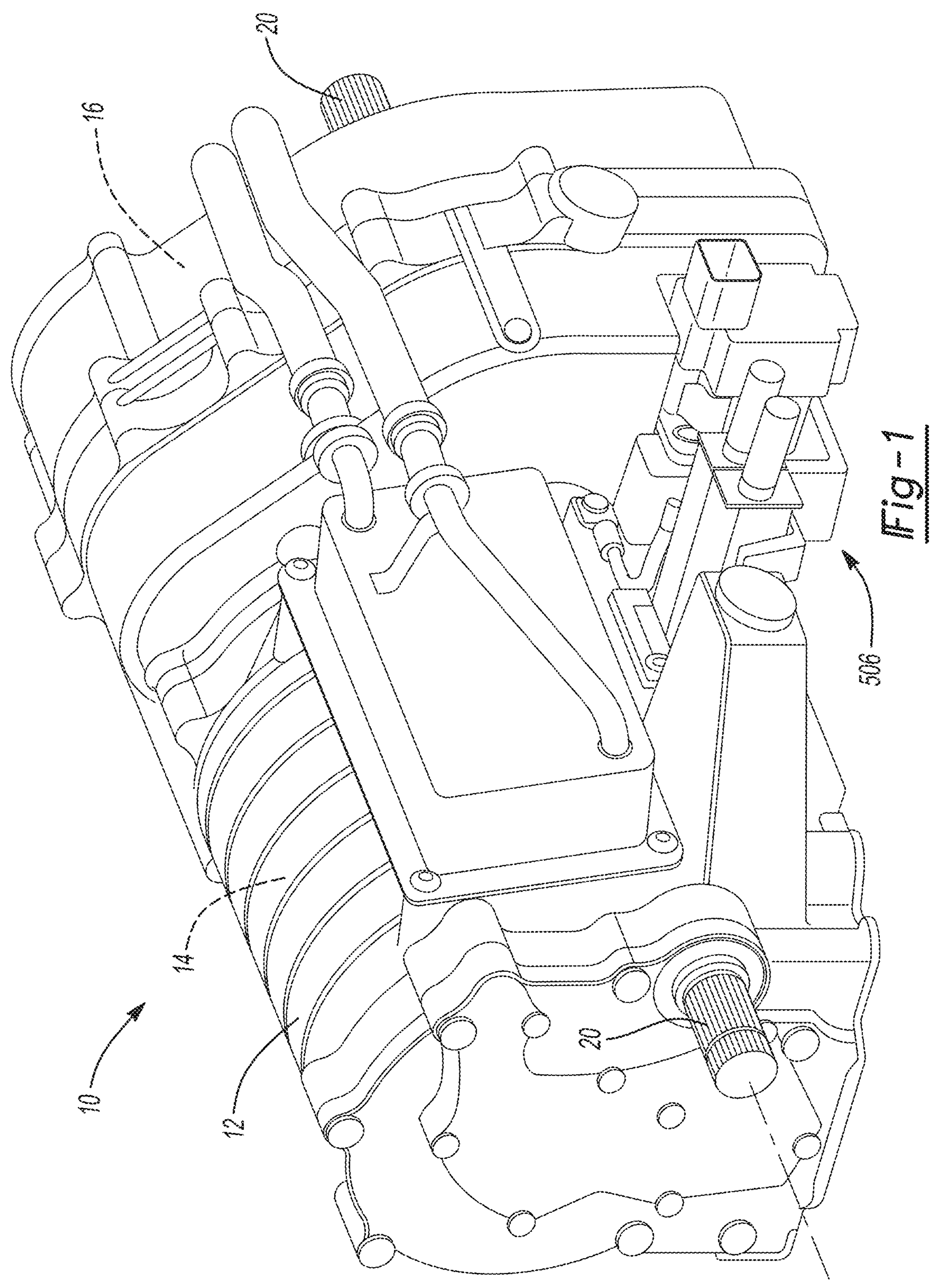
FIG. 1 is a perspective view of an exemplary electric drive unit constructed in accordance with the teachings of the present disclosure.
Figure 2:
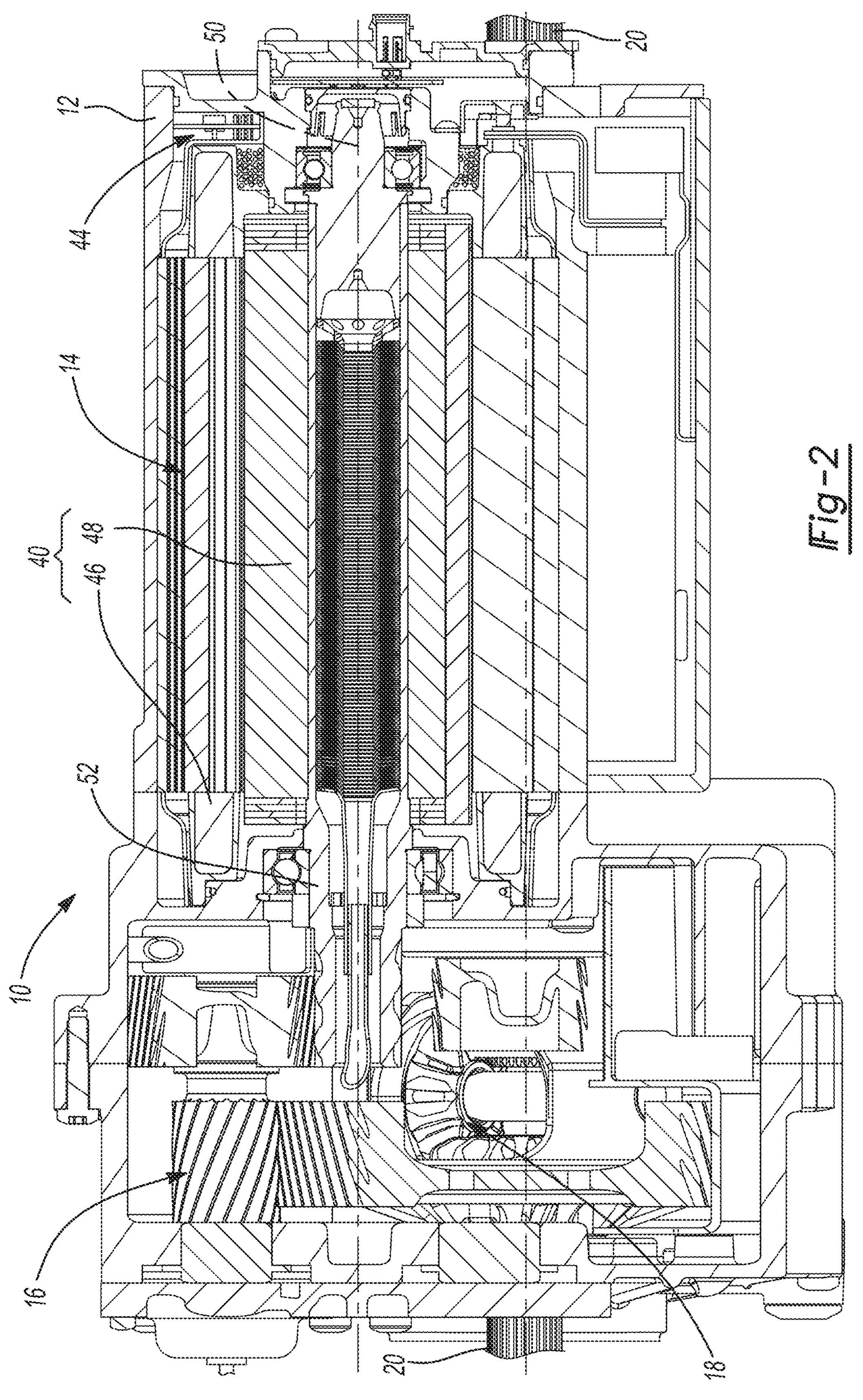
FIG. 2 is a longitudinal cross-section view of the electric drive unit of FIG. 1.

In FIGS. 1 and 2, an exemplary electric drive unit constructed in accordance with the teachings of the present disclosure is generally indicated by reference numeral 10. Components, aspects, features and functions of the electric drive unit 10 that are not expressly described herein or shown (partly or fully) in the accompanying drawings, could be configured or function in a manner that is similar to the components, aspects, features and/or functions of electric drive units that is described in co-pending U.S. Provisional Patent Application No. 63/161,164 filed Mar. 15, 2021, the disclosure of which is incorporated by reference as if fully set forth in detail herein. In brief, the electric drive unit 10 includes a housing assembly 12, a motor assembly 14, a transmission 16, a differential assembly 18, a pair of output shafts 20, which are rotatable about an output axis 22, and a lubrication and cooling system 24. Rotary power provided by the motor assembly 14 is transmitted through the transmission 16 to the differential assembly 18 to drive the output shafts 20. The lubrication and cooling system 24 is configured to circulate a fluid through the housing assembly 12, the motor assembly 14, the transmission 16 and the differential assembly 18 to cool and/or lubricate various components of the motor assembly 14, the transmission 16 and the differential assembly 18.

With specific reference to FIG. 2, the motor assembly 14 comprises an electric motor 40, and a motor control unit that includes an inverter 44. The electric motor 40 includes a stator 46 and a rotor 48 that is rotatable about a motor output axis 50. The rotor 48 includes a motor output shaft 52.

Figure 3:
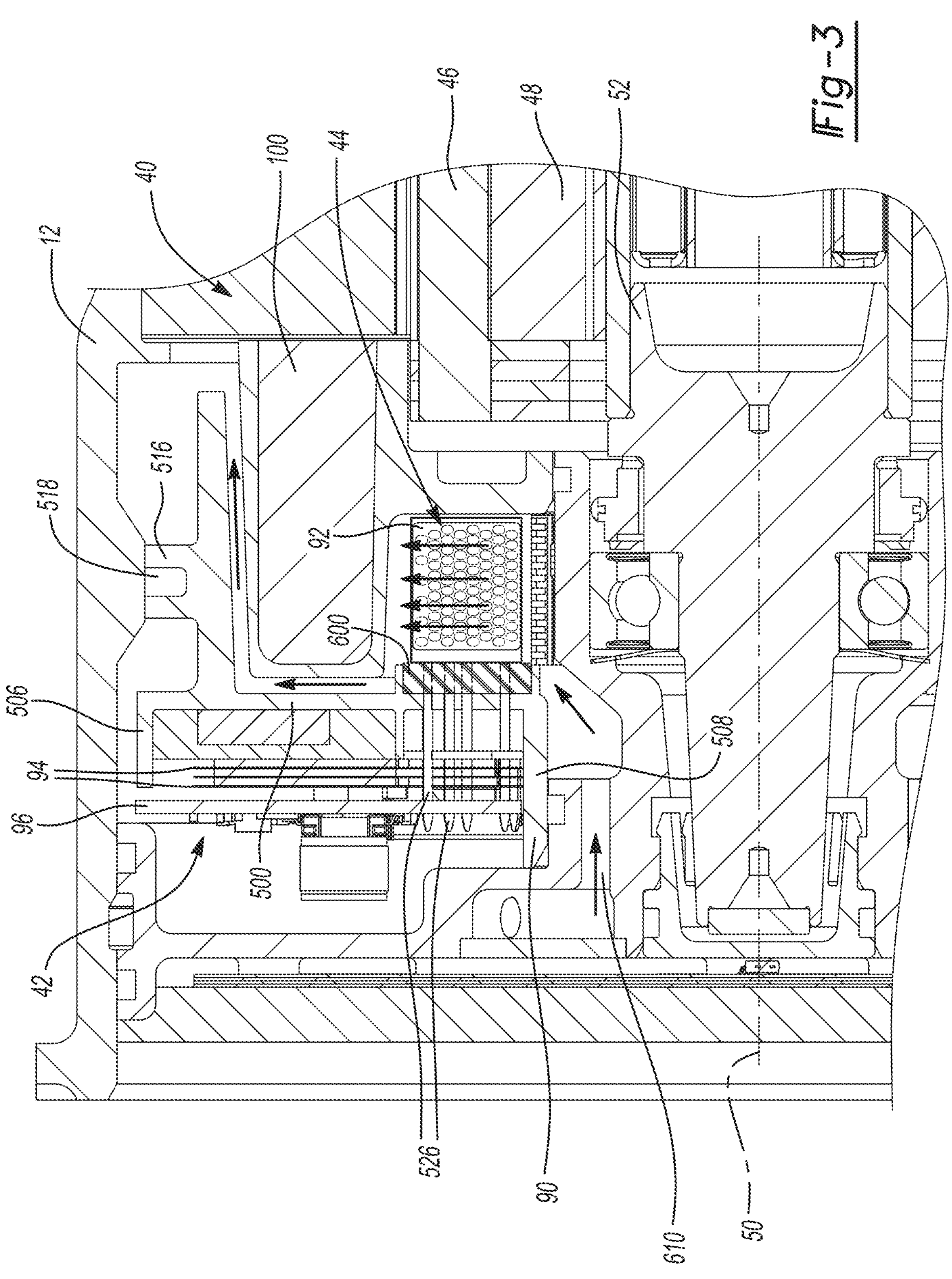
FIG. 3 is sectional view of a portion of the electric drive unit of FIG. 1, the view illustrating an inverter of a motor assembly in greater detail.
Figures 4, 5:
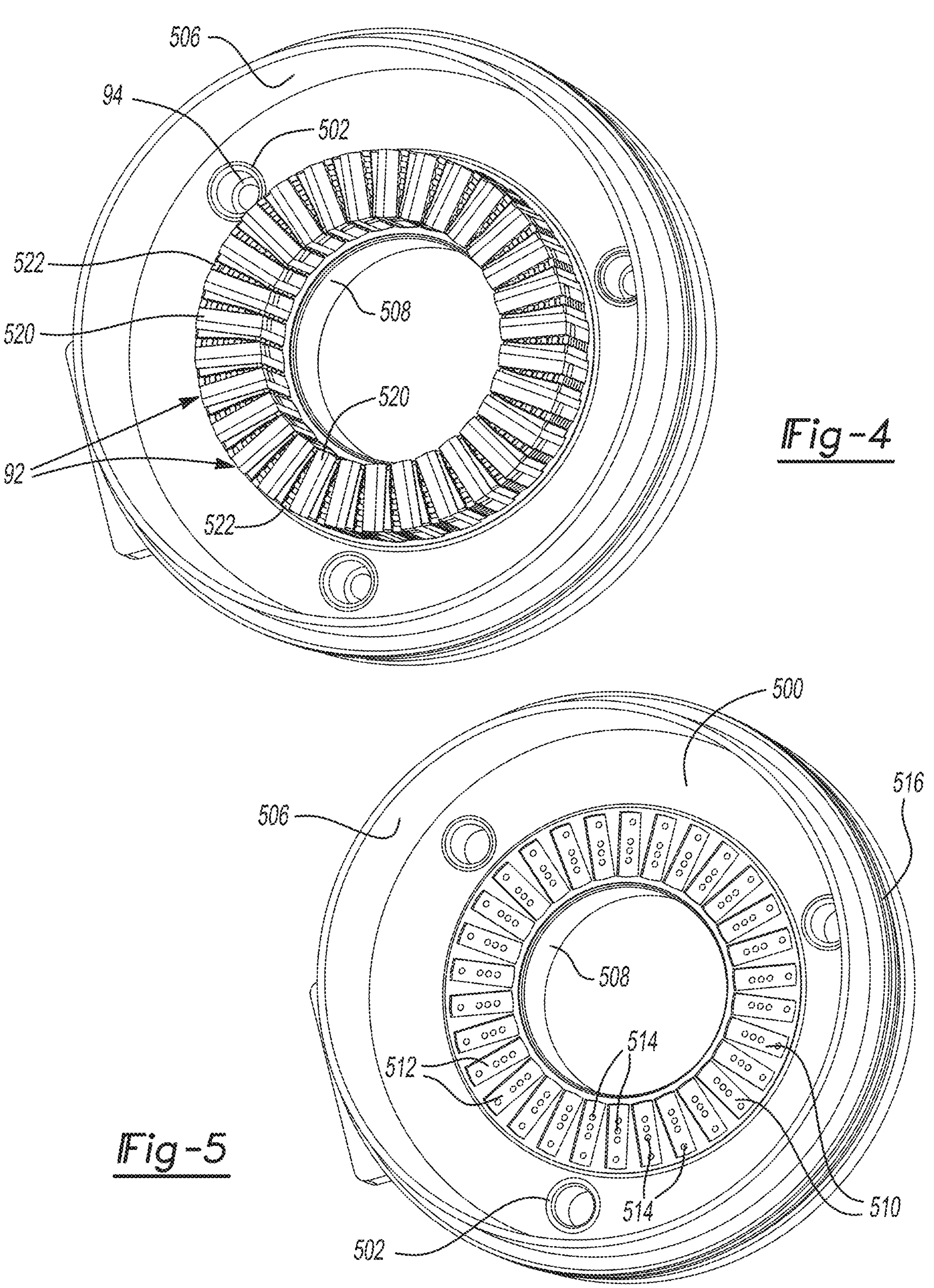
FIG. 4 is a perspective view of a portion of the inverter.
FIG. 5 is a perspective view of a portion of the inverter, the view illustrating an inverter mount in more detail.

In FIGS. 3 and 4, the inverter 44 is shown to include an inverter mount 90, a plurality of heat-sinked power semiconductors 92, a plurality of busbars 94 and an inverter circuit board 96. The inverter mount 90 is employed to couple the inverter 44 to the housing assembly 12 and to the stator 46 of the motor 40. The busbars 94, which are schematically shown, include a positive busbar, which is electrically coupled to a source of electrical power, ground busbar, which is coupled to an electric ground, and a plurality of phase busbars. The inverter 44 is configured to control the amplitude and frequency of the power supplied to the electric motor 40. More specifically, the inverter 44 employs the heat-sinked power semiconductors 92 to control the switching of DC electricity to create three AC electric outputs, where each AC electric output is associated with a given phase of the windings 100 of the stator 46. Each phase of the windings 100 is fixedly and electrically coupled an associated one of the (phase) busbars 94 in the inverter 44 and as such, each of the three AC electrical outputs is transmitted through an associated one of the phase busbars.

With reference to FIGS. 3 and 5, the inverter mount 90 is illustrated in more detail. The inverter mount 90 can include a base 500, a plurality of terminal receptacles 502, a first side wall 506 and a second side wall 508. The base 500 can have a generally annular configuration. A first axial side or face of the base 500 can have a central portion that is somewhat thicker than an outer portion that is disposed radially outwardly of the central portion. A second, opposite side or face of the base 500 can be flat. The base 500 can define a plurality of semiconductor mounts 510 that can be formed into the central portion on the first face of the base 500. Each of the semiconductor mounts 510 can define a semiconductor recess 512 and a plurality of semiconductor terminal apertures 514. The semiconductor mounts 510 can be disposed in any desired arrangement, but in the particular example provided, the semiconductor mounts 510 are disposed in a ring-shaped arrangement. The semiconductor terminal apertures 514 are disposed in each the semiconductor recess 512 and are formed through the base 500. Each of the terminal receptacles 502 can have a first portion, which is located on the portion of the base 500 that is disposed radially outwardly of the central portion and which extend axially away from the first face of the base 500, and a second portion that extends axially away from the second face of the base 500. In the example shown, each of the terminal receptacles 502 is a generally tubular structure that is disposed through the outer portion of the base 500. The terminal receptacles 502 can be spaced circumferentially apart from one another. Each of the sensor receptacles 504 can extend from the second face of the base 500 and can intersect an associated one of the terminal receptacles 502. The first and second sidewalls 506 and 508 can be fixedly coupled to the base 500 and can encircle the outer perimeter and the inner perimeter, respectfully, of the base 500. The first side wall 506 can extend from the first face of the base 500 by a relatively large distance and from the second face of the base 500 by a relatively short distance. The second side wall 508 can extend from the second face of the base 500 by a relatively large distance and from the first face of the base by a relatively small distance. A seal groove 516 is formed about the first side wall 506 and is configured to receive a seal 518 therein that sealingly engages the first side wall 506 and the housing assembly 12.

Figures 6, 7:
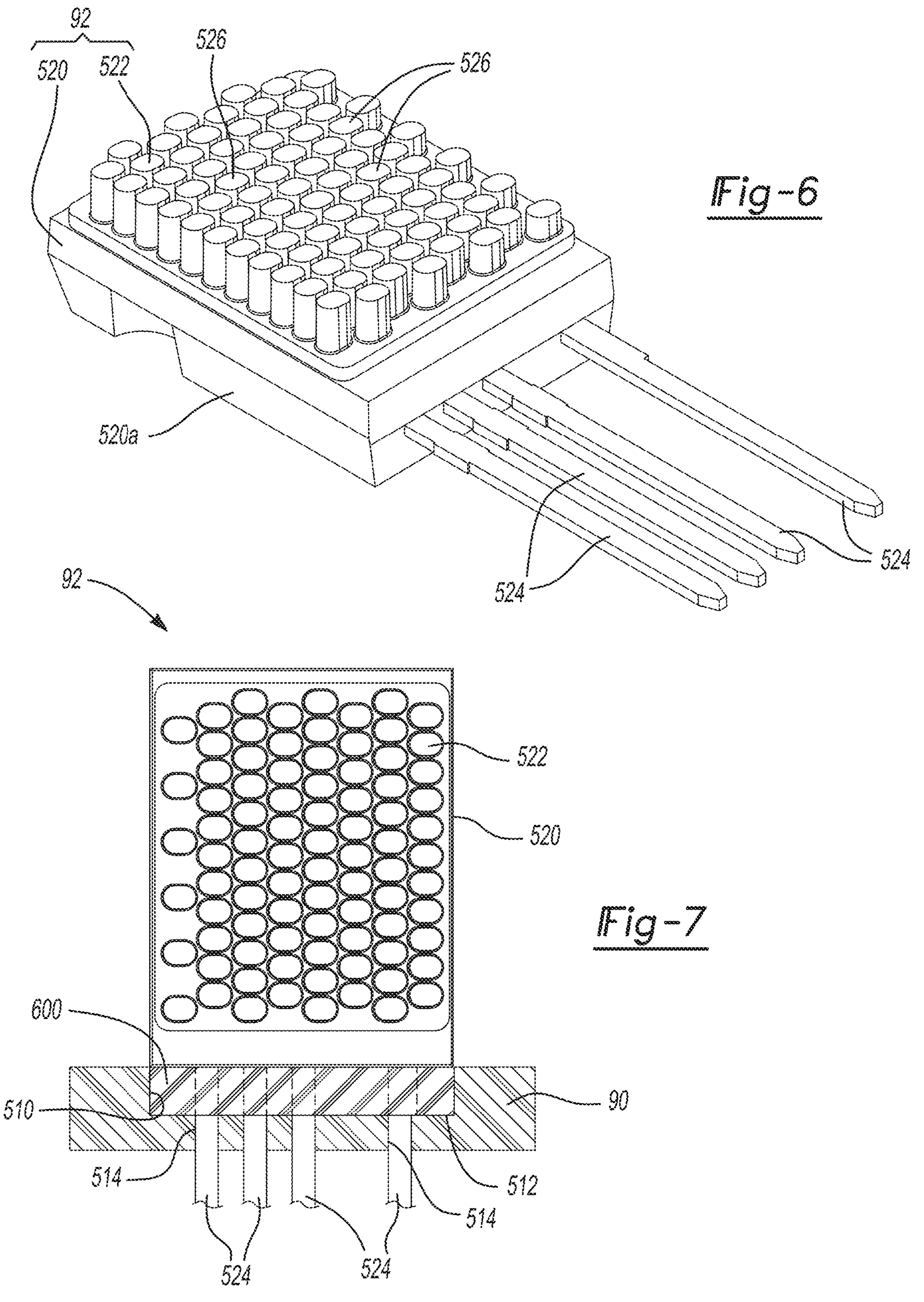
FIG. 6 is a perspective view of a portion of the inverter, the view illustrating a heat-sinked power semiconductor in more detail.
FIG. 7 is a sectional view of a portion of the inverter, the view illustrating a seal member disposed between the inverter mount and a body of a power semiconductor of the heat-sinked power semiconductor.

In FIGS. 4 and 6, each of the heat-sinked power semiconductors 92 includes a power semiconductor 520 and a heat sink 522. The power semiconductor 520 can be any appropriate device, such as a MOSFET or an IGBT, and can include a plurality of pins or terminals 524. The heat sink 520 can be formed of a suitable thermally conductive material and can be electrically coupled to an associated one of the terminals 524. As a non-limiting example, the heat sink 522 could be formed of a metal material, such as aluminum, brass, bronze or copper. The heat sink 522 can define a plurality of fins 526 that can be employed to discharge heat into a flow of fluid passing through the fins 526. The fins 526 are depicted as rods that project orthogonally from a base of the heat sink 522. The distal ends of the fins 526 are tapered so that the fins 526 of one heat-sinked power semiconductor 92 do not touch an adjacent heat-sinked power semiconductor, but it will be appreciated that the configuration of the fins 526 could be different from that which is depicted in the drawings to balance considerations for heat transfer and flow restriction to desired degrees.

With reference to FIGS. 3 through 5 and 7, each of the heat-sinked semiconductor assemblies 92 can be mounted in a respective one of the semiconductor mounts 510 on the inverter mount 90 such that each of the heat-sinked power semiconductors 92 is received into a corresponding one of the semiconductor recesses 512 and the terminals 524 on each of the heat-sinked power semiconductors 92 are received through the semiconductor terminal apertures 514. A seal member 600 can be disposed between a body **520*a* (FIG. 6) of the power semiconductor 520 and the inverter mount 90. The seal member 600 is configured to form a seal between the power semiconductor 520 and the inverter mount 90. In the example provided, individual seal members 600 are disposed in each of the semiconductor recesses 512 and sealingly engage the terminals 524 of the power semiconductor 520 and the inverter mount 90 to inhibit the flow of fluid through the semiconductor terminal apertures 514. The seal member 600 could have pre-formed holes therethrough that are configured to receive corresponding terminals 524 of the power semiconductor 520. Alternatively, the terminals 524 of a power semiconductor 520 could pierce the seal member 600 when the heat-sinked power semiconductor 92 is assembled to the inverter mount 90. While the seal members 600 have been illustrated and described herein as each being a discrete component that is assembled to the inverter mount 90, it will be appreciated that the seal members 600 could be unitarily and integrally formed (e.g., in an annular ring), and that the seal members 600 could optionally be overmolded onto the inverter mount 90**.

With reference to FIG. 3, a coolant fluid enters the inverter 44 through a gallery 610 in the housing assembly 12 and is directed through the fins 526 (FIG. 6) in the heat-sinked power semiconductors 92 before the coolant is routed into the stator 46 of the motor 40. The seal member 600 inhibits the flow of coolant through the base 500 of the inverter mount 90 so that the coolant does not come into contact with the inverter circuit board 96 or the bus bars 94.

Figure 8:
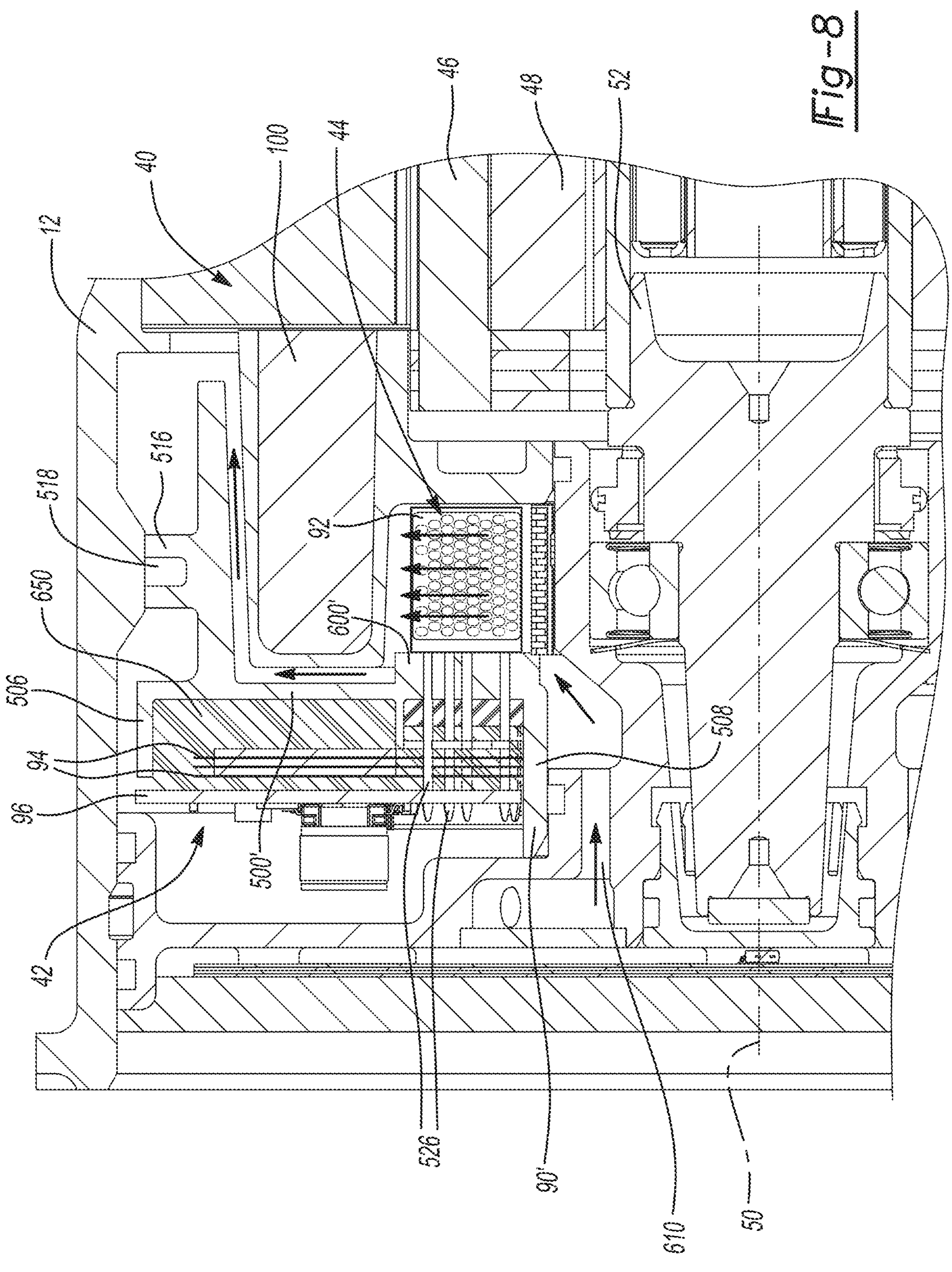
FIG. 8 is a sectional view of a portion of an inverter of another electric drive unit constructed in accordance with the teachings of the present disclosure.
Figure 9:
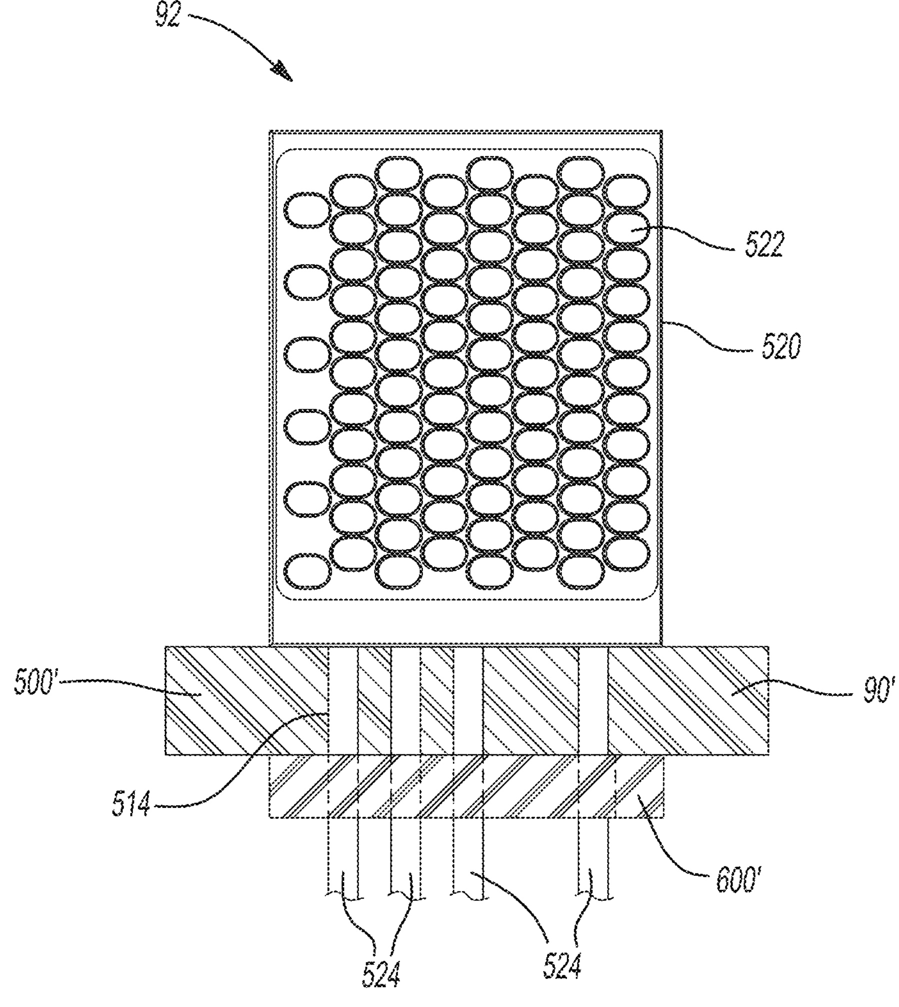
FIG. 9 is a sectional view of a portion of the inverter of FIG. 8 illustrating the seal member in an alternate location.

While the seal members 600 have been illustrated and described as abutting both the base 500 of the inverter mount 90 and the body **520*a* (FIG. 6) of the power semiconductor 520, it will be appreciated that the seal members 600 could be configured somewhat differently. For example, the seal members 600 need not abut or engage the bodies 520*a* (FIG. 6) of the power semiconductors 520, but rather could be configured to sealingly engage the inverter mount 90 and the terminals 524 to inhibit the flow of fluid through the terminal apertures 514. The example of FIGS. 8 and 9 is similar to the example that is discussed in detail, above, except that the seal members 600' are disposed on a side of the base 500' of the inverter mount 90' that is opposite the body of the power semiconductor 520. In this example, each seal member 600' is sealingly engaged to the base 500' of the inverter mount 90' and to the terminals 524 of a corresponding one of the power semiconductors 520. Like the above-described example, the seal members 600' can be discrete components, or could be unitarily and integrally formed (e.g., as an annular ring), and/or could be molded onto the inverter mount 90'. Advantageously, the seal members 600' in this example help to retain the heat-sinked power semiconductors 92 to the base 500' of the inverter mount 90' prior to the assembly of the bus bars 94 to the terminals 524 of the power semiconductors 520**.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electric drive unit comprising:

a motor assembly having a stator, a rotor and an inverter, the stator having a plurality of windings, the rotor being rotatably disposed within the stator, the inverter having an inverter mount, a plurality of heat-sinked power semiconductors, and a plurality of seal members, the inverter mount having a base that defines a plurality of semiconductor terminal apertures, each of the heat-sinked power semiconductors having a power semiconductor and a heat sink, the power semiconductor having a body and a plurality of terminals that extend from the body, the heat sink being fixedly and thermally coupled to the body of the power semiconductor, wherein the terminals of each of the power semiconductors are received through a corresponding one of the seal members and through an associated set of the semiconductor terminal apertures, the seal members forming seals between the power semiconductor and the inverter mount that inhibits fluid flow through the semiconductor terminal apertures, and wherein each of the seal members is disposed on side of the inverter mount that is opposite the bodies of the power semiconductors.

2. The electric drive unit of claim 1, wherein each of the seal members is a discrete component.

3. The electric drive unit of claim 1, wherein a plurality of the seal members are fixedly coupled to one another.

4. The electric drive unit of claim 3, wherein all of the seal members are fixedly coupled to one another.

5. The electric drive unit of claim 1, wherein the seal members are overmolded onto the inverter mount.

6. The electric drive unit of claim 1, wherein each of the seal members is disposed between the inverter mount and the body of an associated one of the power semiconductors.

7. The electric drive unit of claim 6, wherein the inverter mount defines a plurality of semiconductor recesses, wherein each set of terminal apertures intersects an associated one of the semiconductor recesses, and wherein each seal member is received in a corresponding one of the semiconductor recesses.

8. An electric drive unit comprising:

a motor assembly having a stator, a rotor and an inverter, the stator having a plurality of windings, the rotor being rotatably disposed within the stator, the inverter having an inverter mount, a plurality of heat-sinked power semiconductors, and a plurality of seal members, the inverter mount having a base that defines a plurality of semiconductor terminal apertures, each of the heat-sinked power semiconductors having a power semiconductor and a heat sink, the power semiconductor having a body and a plurality of terminals that extend from the body, the heat sink being fixedly and thermally coupled to the body of the power semiconductor, wherein the terminals of each of the power semiconductors are received through a corresponding one of the seal members and through an associated set of the semiconductor terminal apertures, the seal members forming seals between the power semiconductor and the inverter mount that inhibits fluid flow through the semiconductor terminal apertures, wherein each of the seal members is disposed between the inverter mount and the body of an associated one of the power semiconductors, and wherein the inverter mount defines a plurality of semiconductor recesses, wherein each set of terminal apertures intersects an associated one of the semiconductor recesses, and wherein each seal member is received in a corresponding one of the semiconductor recesses.

* * * * *